United States Patent
Kim

(10) Patent No.: US 7,867,833 B2
(45) Date of Patent: Jan. 11, 2011

(54) SEMICONDUCTOR DEVICE UTILIZING A METAL GATE MATERIAL SUCH AS TUNGSTEN AND METHOD OF MANUFACTURING THE SAME

(75) Inventor: Tae Kyun Kim, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 12/643,067

(22) Filed: Dec. 21, 2009

(65) Prior Publication Data

US 2010/0093144 A1 Apr. 15, 2010

Related U.S. Application Data

(62) Division of application No. 11/502,072, filed on Aug. 10, 2006, now Pat. No. 7,659,572.

(30) Foreign Application Priority Data

Aug. 18, 2005 (KR) ...................... 10-2005-0075804

(51) Int. Cl.
*H01L 21/338* (2006.01)

(52) U.S. Cl. ...................... 438/175; 438/270; 438/282; 257/E21.655; 257/E21.428

(58) Field of Classification Search ................. 438/175, 438/197, 270, 272, 282, 585; 257/E21.428, 257/E21.655
See application file for complete search history.

(56) References Cited

U.S. PATENT DOCUMENTS

| 7,553,737 | B2* | 6/2009 | Huang et al. | 438/386 |
|---|---|---|---|---|
| 7,659,572 | B2* | 2/2010 | Kim | 257/330 |
| 2004/0135176 | A1* | 7/2004 | Kim | 257/243 |
| 2005/0106820 | A1* | 5/2005 | Tran | 438/270 |
| 2010/0044797 | A1* | 2/2010 | Lee | 257/366 |

* cited by examiner

*Primary Examiner*—Ha Tran T Nguyen
*Assistant Examiner*—Daniel Whalen
(74) *Attorney, Agent, or Firm*—Ladas & Parry LLP

(57) ABSTRACT

Known drawbacks associated with use of tungsten as a gate material in a semiconductor device are prevented. A gate oxide layer, a polysilicon layer, and a nitride layer are sequentially formed on a semiconductor substrate having a isolation layer for defining the active region. A groove is formed by etching the nitride layer. A metal nitride layer is formed to an U shape in the groove, and then a metal layer is formed to bury the groove. A hard mask layer is formed for defining a gate forming region on the nitride layer, the metal nitride layer, and the metal layer. A metal gate is formed by etching the nitride layer, the polysilicon layer, and the gate oxide layer using the hard mask layer as an etch barrier.

12 Claims, 6 Drawing Sheets

SEMICONDUCTOR DEVICE UTILIZING A METAL GATE MATERIAL SUCH AS TUNGSTEN AND METHOD OF MANUFACTURING THE SAME

CROSS-REFERENCE TO RELATED APPLICATIONS

This application is a divisional of U.S. patent application Ser. No. 11/502,072, filed on Aug. 10, 2006 now U.S. Pat. No. 7,659,572, and claims priority to Korean Patent Application No. 10-2005-0075804 which was filed on Aug. 18, 2005. Both applications are Incorporated herein by reference in their entirety.

BACKGROUND OF THE INVENTION

1. Field of the Invention

The present invention relates, in general, to a semiconductor device having a gate, and more particularly to a semiconductor device for preventing the drawbacks due to the use of tungsten as the gate material.

2. Description of the Related Art

For increasingly high integration of the semiconductor devices, the channel length of a transistor is significantly shortened and the threshold voltage of the transistor is set to decrease abruptly, all of which contribute to the so-called "short channel effect" to become more serious. In an effort to increase a channel length of a transistor, many researches for a recess gate were conducted, according to which a recess is defined on a silicon substrate to increase a transistor channel length. A recess gate forming method increases a channel length by forming a gate in a recess; thus, the short channel effect can be reduced when it is compared to a conventional planar gate structure.

Therefore, as the integration degree of a semiconductor device increases, a material having a very low resistance (such as tungsten) is known for use as a gate material when forming a recess gate in order to decrease the resistance of the gate.

Hereafter, a conventional method of forming a recess gate in a semiconductor device which uses tungsten as the gate material is described with reference to FIGS. 1A through 1D.

Referring to FIG. 1A, a isolation layer 2 is formed in a semiconductor substrate 1 through a shallow trench isolation (STI) process to define the active region. Then, an oxide layer 3 and a hard mask layer 4 are sequentially deposited on the substrate 1, which are going to be used as an etch barrier layer for forming a recess gate.

Referring to FIG. 1B, the hard mask layer 4 and the oxide layer 3 are sequentially etched to formed an etch mask through which a plurality of the gate forming regions of the substrate 1 are exposed. Then, the exposed portions of the substrate 1 are etched using the etch mask formed by the etched hard mask layer 4 and the oxide layer 3, to form recesses 5. After forming the recesses 5, the hard mask layer 4 and the oxide layer 3 are sequentially removed. As shown in FIG. 1B, Here, when etching the substrate 1 to define the recess 5, the portions in the isolation layer 2 of the substrate 1 are also partially etched.

Referring to FIG. 1C, a gate oxide layer 6 is formed on the surface of the active region of the substrate 1 including the surface of the recesses 5 in the active region. Then, a polysilicon layer 7, a tungsten nitride layer 8, a tungsten layer 9, and a gate hard mask layer 10 are sequentially formed on the surface of the resultant substrate 1, and these layers are then patterned to form tungsten gates 11 on the recesses 5.

Referring to FIG. 1D, a gate selective oxidation process is performed on the resultant substrate 1 in order to form a re-oxidation layer 12 on the surface of the etched polysilicon layer 7 and on the surface of the active region of the substrate 1 as shown in FIG. 1D. Thereafter, in order to prevent the abnormal oxidization of tungsten by a subsequent process, a gate capping nitride layer 13 is formed on the entire surface of the resultant substrate 1 including the tungsten gate 11.

However, when tungsten is used as the gate material, if process and equipment conditions become unstable while the gate selective oxidization process is conducted, the possibility of an abnormal oxidization phenomenon to occur increases, in which a re-oxidation layer is abnormally formed on tungsten. Also, due to the fact that oxygen can intrude through the tungsten layer 9 to form an insulation layer between tungsten 9 and polysilicon 7 while conducting the gate selective oxidization process and due to issues such as the contamination of tungsten, etc., a detrimental defect can be caused when operating the semiconductor device.

SUMMARY OF THE INVENTION

Accordingly, the present invention has been made in an effort to solve the problems occurring in the related art, and one of many objects of the present invention is to provide a semiconductor device which can prevent a drawback due to the use of tungsten as gate material, and a method for manufacturing the same.

In order to achieve the above object, according to one aspect of the present invention, there is provided a semiconductor device comprising a semiconductor substrate having a isolation layer for defining an active region; and a metal gate formed on the active region of the substrate and capped on side surfaces thereof by a nitride layer.

According to another aspect of the present invention, a recess is defined on a portion of the active region of the semiconductor substrate at which a gate is formed.

According to another aspect of the present invention, a metal nitride layer is intervened between a metal layer constituting the metal gate and the nitride layer.

According to another aspect of the present invention, the metal nitride layer is formed to surround side surfaces and a bottom surface of the metal layer.

According to another aspect of the present invention, the metal gate includes a gate oxide layer and a polysilicon layer which are stacked in the shape of a pattern; a metal nitride layer formed on the polysilicon layer in the shape of U; a metal layer buried in the metal nitride layer; the nitride layer formed on sides of the metal nitride layer; and a hard mask layer formed on the nitride layer, the metal nitride layer and the metal layer in the shape of a pattern.

According to another aspect of the present invention, an entire width of the combined nitride layer, metal nitride layer and metal layer is the same as a width of the polysilicon layer.

According to another aspect of the present invention, the metal nitride layer comprises a tungsten nitride layer, the metal layer comprises a tungsten layer, and the hard mask layer comprises a nitride layer.

According to another aspect of the present invention, the semiconductor device further comprising source and drain regions formed in the active region of the substrate at sides of the metal gate.

In order to achieve the above object, according to another aspect of the present invention, there is provided a method for manufacturing a semiconductor device, comprising the steps of forming sequentially a gate oxide layer, a polysilicon layer, and a nitride layer on a semiconductor substrate having an active region and a isolation layer defining the active region, wherein the at least one first recess is formed in the active region of the semiconductor substrate; defining a second recess in the active region by etching the nitride layer; forming a metal nitride layer in the second recess such that a two-dimensional cross-sectional profile of the metal nitride layer formed in the second recess substantially resemble the shape of U; forming a metal layer on the metal nitride layer filling the second recess; forming a hard mask layer on the nitride layer, the metal nitride layer, and the metal layer; and forming a metal gate by etching the nitride layer, the polysilicon layer and the gate oxide layer using the hard mask layer as an etch barrier.

According to another aspect of the present invention, the method further comprises the step of defining a recess on a portion of the active region of the semiconductor substrate at which the gate is to be formed before forming the gate oxide layer on the semiconductor substrate.

According to another aspect of the present invention, the nitride layer is formed in the thickness of 300~700 Å.

According to another aspect of the present invention, the recess is defined to have a width which is less than that of a gate which is desired to be formed.

According to another aspect of the present invention, the step of forming a metal nitride layer in the recess in the shape of U and then a metal layer to bury the recess comprises the sub-steps of forming the metal nitride layer on the nitride layer including the recess to a uniform thickness; forming the metal layer on the metal nitride layer to bury the recess; and CMPing the metal layer and the metal nitride layer to expose the nitride layer.

According to another aspect of the present invention, the metal nitride layer comprises a tungsten nitride layer and the metal layer comprises a tungsten layer.

According to another aspect of the present invention, the tungsten nitride layer is formed in the thickness of 50~100 Å.

According to another aspect of the present invention, the tungsten layer is formed in the thickness of 500~1,000 Å.

According to another aspect of the present invention, the method further comprises the step of conducting a gate re-oxidation process after forming the metal gate.

According to still another aspect of the present invention, the gate re-oxidation process is conducted such that a re-oxidation layer having a thickness of 30~100 Å is formed on the etched polysilicon layer and gate oxide layer and a surface of the active region of the substrate.

According to yet still another aspect of the present invention, the method further comprises the step of forming source and drain regions in the surface of the active region of the substrate at both sides of the metal gate after conducting the gate re-oxidation process.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1A:
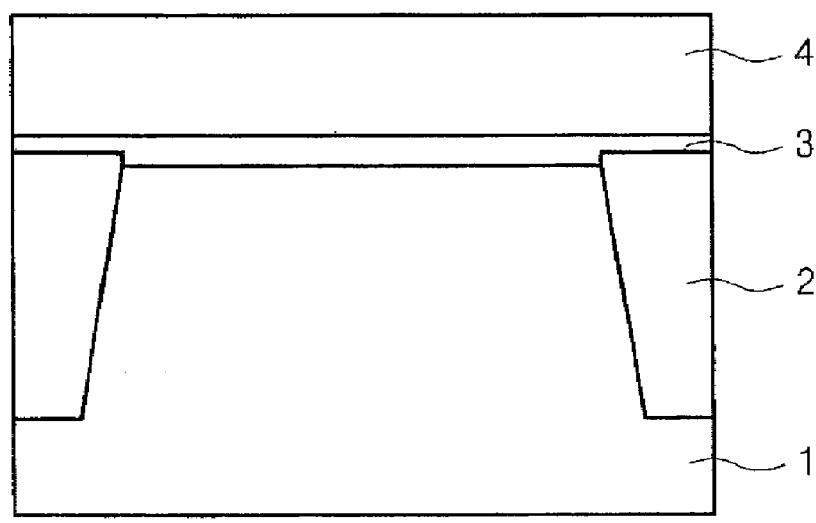
FIGS. 1A through 1D are cross-sectional views for explaining the process steps of a method of forming a recess gate according to the conventional art.
Figure 1B:
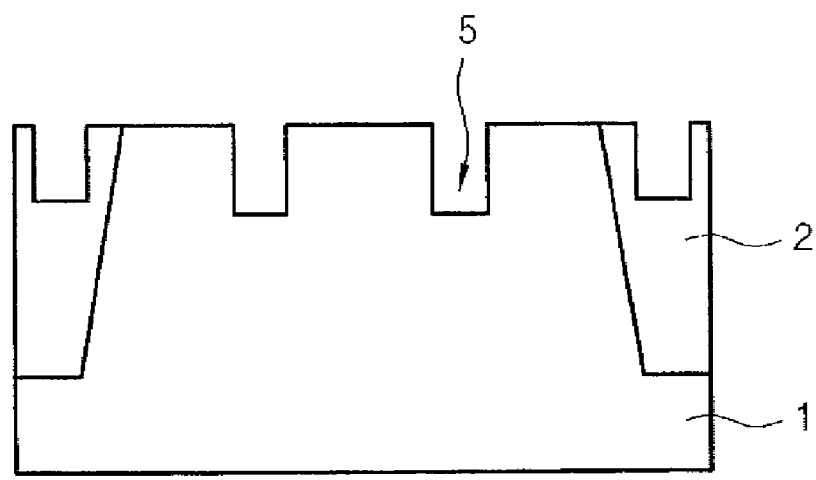
Figure 1C:
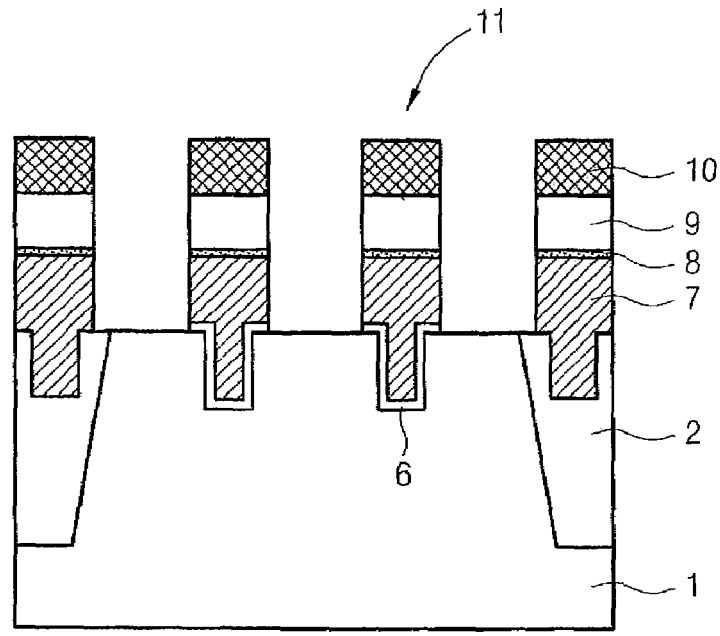
Figure 1D:
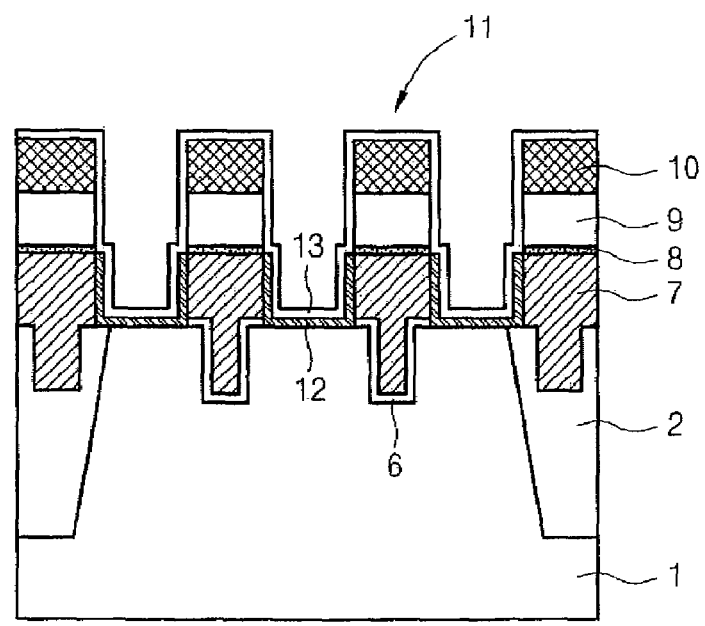

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 2A through 2G are cross-sectional views for explaining the process steps of a method for manufacturing a semiconductor device in accordance with an embodiment of the present invention.

Figure 2A:
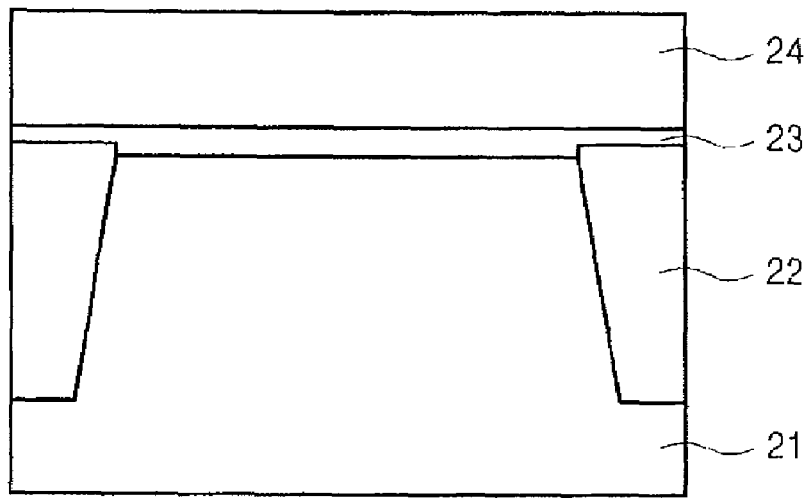
FIGS. 2A through 2G are cross-sectional views for explaining the process steps of a method of manufacturing a semiconductor device in accordance with an embodiment of the present invention.

Referring to FIG. 2A, a semiconductor substrate 21 having an active region and a isolation layer 22 (which delimits the active region) is provided. Then, an oxide layer 23 and a hard mask layer 24 are sequentially deposited on the substrate 21.

Figure 2B:
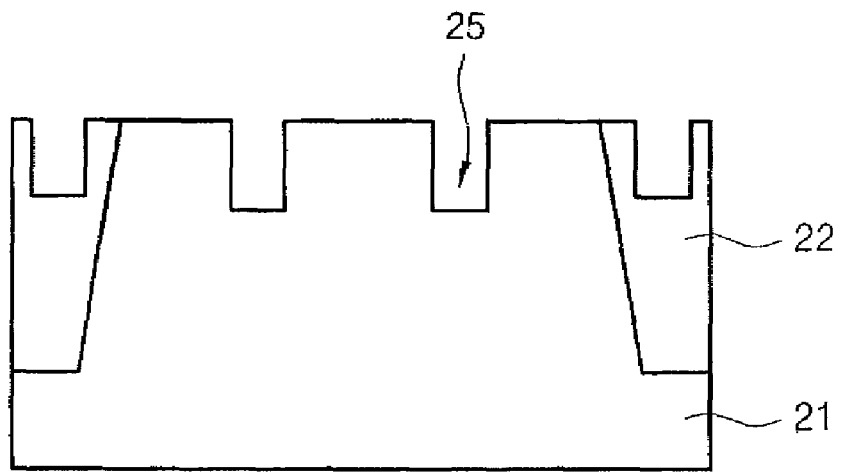

Referring to FIG. 2B, the hard mask layer 24 and the oxide layer 23 are etched to expose gate forming areas on the active region of the substrate 21. Next, the exposed areas of the substrate 21 is etched using the etched hard mask layer 24 as an etch mask, and thereby at least one first recess 25 is formed in the gate forming areas.

Then, the hard mask layer 24 and the oxide layer 23 are sequentially removed. Here, when etching the substrate 21 to define the first recess 25, the isolation layer 22 may also be partially etched.

Figure 2C:
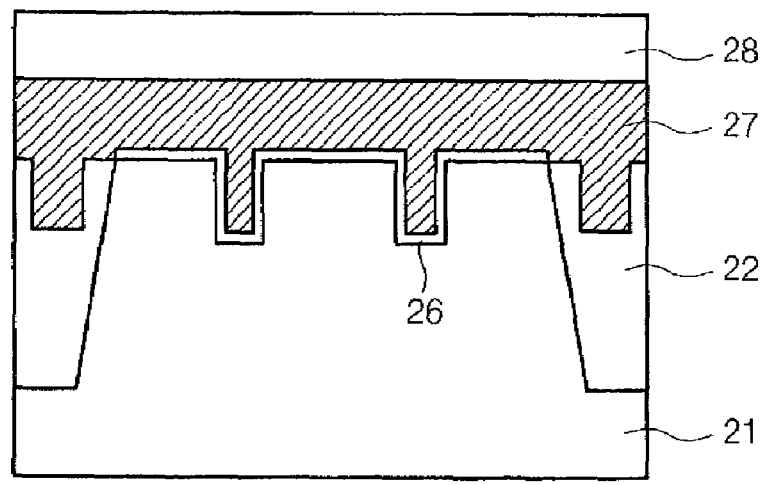

Referring to FIG. 2C, a gate oxide layer 26 is formed on the surface of the active region of the substrate 21 including the surfaces of the first recess 25. Next, a polysilicon layer 27 is formed on the gate oxide layer 26 filling the first recess 25, and then a nitride layer 28 is formed on the polysilicon layer 27. Here, the nitride layer 28 is formed to a thickness in the range of 300~700 Å.

Figure 2D:
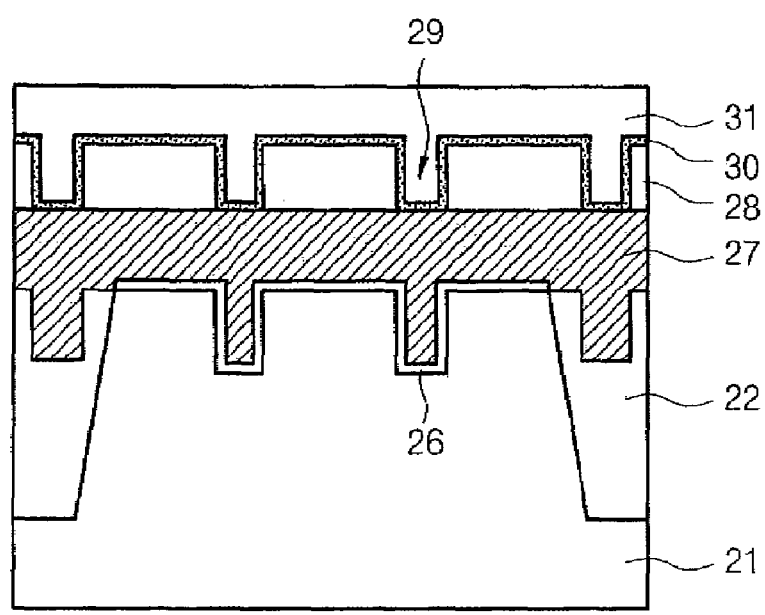

Referring to FIG. 2D, at least one second recess 29 each having a height and a width is formed by a etching process in the nitride layer 28 above the first recess 25. The width of the second recess is less than the width of a gate to be formed later (i.e., the gate 33 shown in FIG. 2F). Thereupon, after a metal nitride layer, for example, a tungsten nitride layer 30 is deposited on the surface of the nitride layer 28 including the surface of the second recess 29. The thickness of the tungsten nitride layer in the range of 50~100 Å. Then, a metal layer, for example, a tungsten layer 31 is deposited on the tungsten nitride layer 30 to a thickness in the range of 500~1,000 Å filling the second recess 29.

Figure 2E:
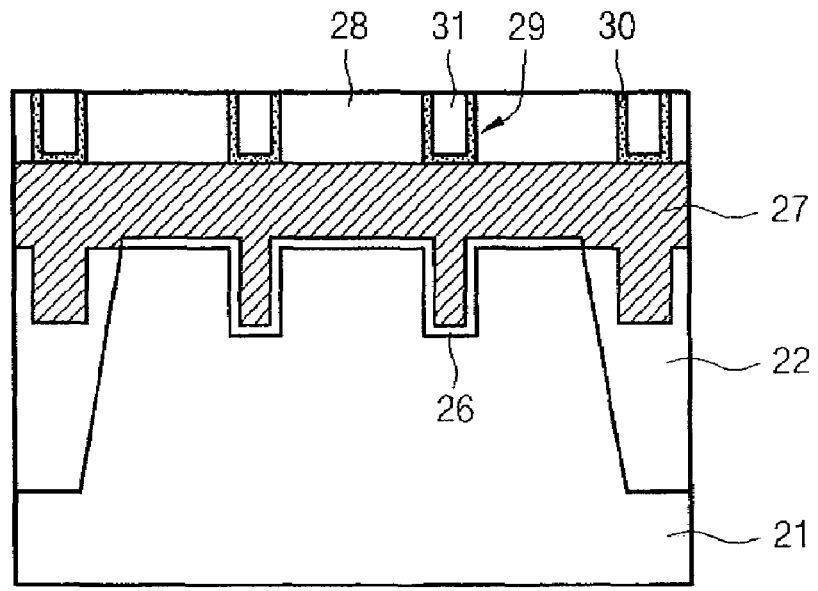

Referring to FIG. 2E, by chemically and mechanically polishing (hereinafter simply referred to as "CMPing") the metal layer 31 (e.g., tungsten) and the metal nitride layer (e.g., tungsten nitride) formed above the height of the second recess 29 until the nitride layer 28 is exposed between two adjacent recesses 29. The second recess 29 is filled with the metal nitride layer 30 and the metal layer 31. As shown in FIG. 2E (as well as FIG. 2F), the metal nitride layer 30 formed inside the second recess 29 has a cross-sectional profile substantially resembling the shape of a "U." As shown in FIG. 2E (and FIG. 2F), the metal layer 31 fills the second recess 29 above the metal nitride layer 31 having the cross-sectional shape substantially resembling a "U."

Figure 2F:
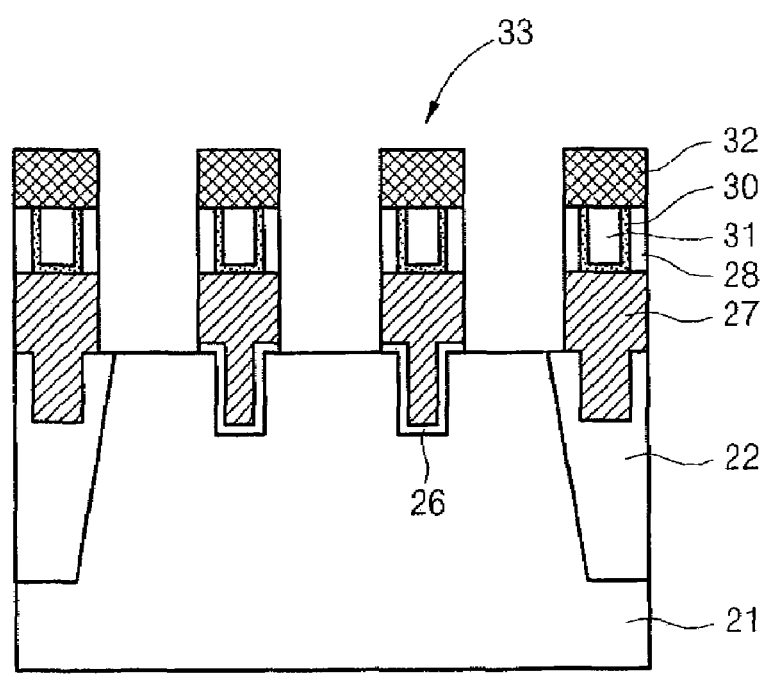

Referring to FIG. 2F, a gate hard mask 32 is formed on the metal layer 31, the metal nitride layer 30, and the nitride layer 28. Thereafter, the nitride layer 28, the polysilicon layer 27, and the gate oxide layer 26 are sequentially etched using the gate hard mask 32 as an etch barrier and forms a metal gate 33. As already discussed above, the width of the metal gate 33 is wider than the width of the second recess 29, in which a metal nitride layer 30 (having a substantially U-shaped cross-sectional profile) is formed. In this regard, the nitride layer 28 remaining after the etch process covers up the metal nitride layer 30. This is also known as that the metal layer 30 "capped" by the nitride layer 28.

Figure 2G:
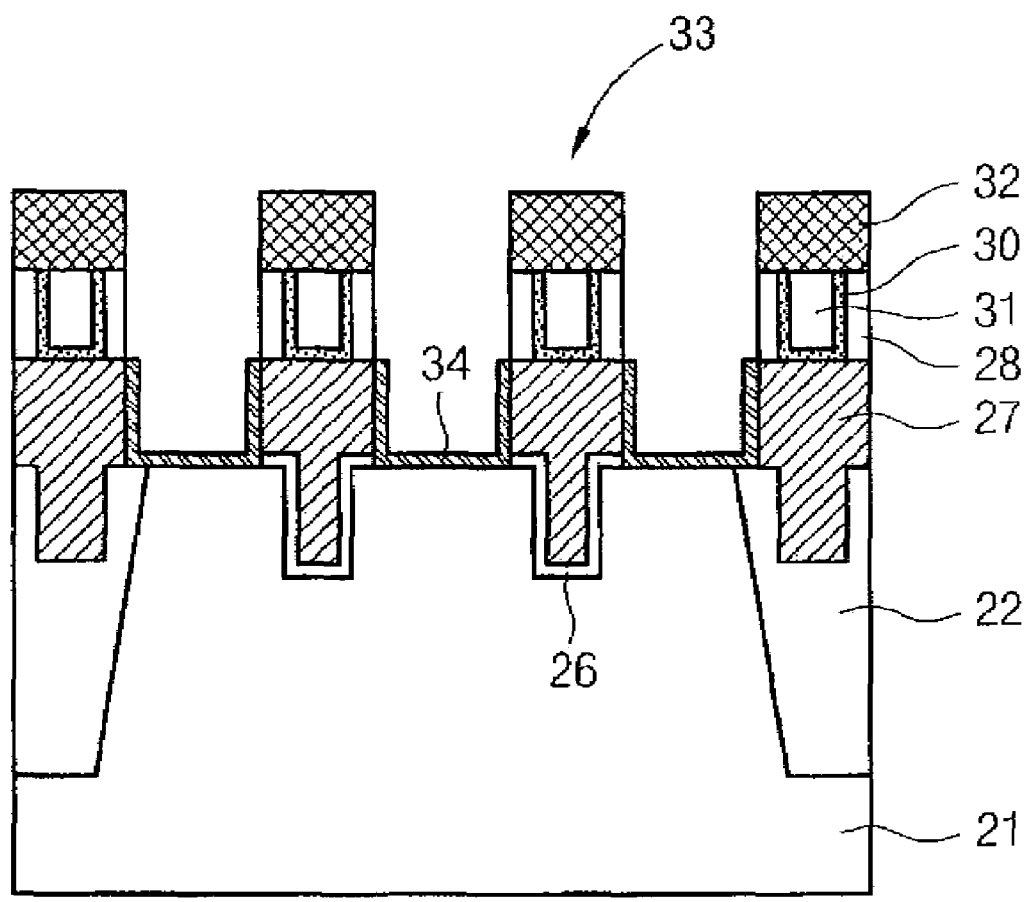

Referring to FIG. 2G, a gate re-oxidation process is conducted for the resultant substrate 21 which is formed with the tungsten gate 33, to eliminate the damage caused due to etching, and thereby a re-oxidation layer 34 is formed on the etched polysilicon layer 27 and gate oxide layer 26 and the surface of the active region of the resultant substrate 21 in the thickness of 30~100 Å.

Thereafter, source and drain regions (not shown) are formed in the surface of the active region of the substrate 21 at both sides of the tungsten gate 33 through the well-known ion implantation process. Then, a series of subsequent processes are conducted to finally manufacture the semiconductor device according to an embodiment of the present invention.

As is apparent from the above description, the semiconductor device and the method of manufacturing the same according to an embodiment of the present invention provide advantages in that, since a metal (or tungsten) layer is capped by a nitride layer, even when conducting a gate re-oxidation process to form a conventional tungsten silicide gate, an abnormal oxidization phenomenon does not occur in the tungsten layer. As a consequence, it is not necessary to conduct a selective oxidization process, which must be otherwise essentially adopted in the conventional art to prevent the abnormal oxidization phenomenon from occurring when forming a tungsten gate. That is to say, because the nitride layer functions to prevent oxidization of the tungsten layer when conducting the gate re-oxidation process, the abnormal oxidization phenomenon does not occur in the tungsten layer while conducting the gate re-oxidation process. Therefore, in the course of mass-producing a device having a tungsten gate, investment cost for manufacturing equipment, that is, selective oxidization equipment can be saved, whereby economic efficiency is improved.

Also, in the present invention, due to the fact that the metal (or tungsten) layer is capped by the nitride layer, when subsequently conducting the gate re-oxidation process, the contamination of tungsten, which is a detrimental defect caused in the conventional art, can be prevented. Therefore, it is possible to prevent an interfacial insulation layer from being formed due to the intrusion of oxygen through the tungsten layer.

Further, in the present invention, since it is not necessary to conduct a separate process for forming a gate capping nitride, which is otherwise needed in the conventional art to prevent the abnormal oxidization of tungsten in a subsequent process, a manufacturing cost can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

We claim:

1. A method of manufacturing a semiconductor device, comprising the steps of:

forming sequentially a gate oxide layer, a polysilicon layer, and a nitride layer on a semiconductor substrate having an active region and a isolation layer defining the active region;

forming a groove in the nitride layer by etching the nitride layer;

forming a metal nitride layer in the groove such that a two-dimensional cross-sectional profile of the metal nitride layer formed in the groove substantially resemble the shape of U;

forming a metal layer on the metal nitride layer filling the groove;

forming a hard mask layer on the etched nitride layer, the metal nitride layer, and the metal layer; and forming a metal gate by etching the etched nitride layer, the polysilicon layer and the gate oxide layer using the hard mask layer as an etch barrier.

2. The method of claim 1, further comprising a step of forming a recess on a portion of the active region of the semiconductor substrate before forming the gate oxide layer on the semiconductor substrate.

3. The method of claim 2, wherein the metal gate is formed on the recess in the active region.

4. The method of claim 1, wherein the nitride layer is formed to a thickness in the range of 300~700 Å.

5. The method of claim 1, wherein the groove has a width shorter than the width of the metal gate.

6. The method of claim 1, wherein the steps of forming a metal nitride layer and a metal layer comprises the sub-steps of:

forming a layer of metal nitride having uniform thickness on the etched nitride layer and on the inner surface of the groove;

forming the metal layer on the metal nitride layer filling the groove; and performing a chemical mechanical polishing process (CMPing) to the metal layer and the metal nitride layer until the metal nitride layer outside the groove are substantially removed to expose the etched nitride layer.

7. The method of claim 1, wherein the metal nitride layer comprises tungsten nitride, and wherein the metal layer comprises tungsten.

8. The method of claim 7, wherein the tungsten nitride layer is formed to a thickness in the range of 50~100 Å.

9. The method of claim 7, wherein the tungsten layer is formed to a thickness in the range of 500~1,000 Å.

10. The method of claim 1, further comprising the step of:
    performing a gate re-oxidation process after forming the metal gate.

11. The method of claim 10, wherein the gate re-oxidation process is performed such that a re-oxidation layer having a thickness in the range of 30~100 Å is formed on the etched polysilicon layer and gate oxide layer and a surface of the active region of the substrate.

12. The method of claim 10, further comprising the step of:
    forming source and drain regions in the active region of the substrate at both sides of the metal gate after conducting the gate re-oxidation process.

\* \* \* \* \*